United States Patent
Horikawa

(10) Patent No.: US 6,780,476 B2
(45) Date of Patent: Aug. 24, 2004

(54) METHOD OF FORMING A FILM USING CHEMICAL VAPOR DEPOSITION

(75) Inventor: Tsuyoshi Horikawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 155 days.

(21) Appl. No.: 10/208,845

(22) Filed: Aug. 1, 2002

(65) Prior Publication Data

US 2003/0054102 A1 Mar. 20, 2003

(30) Foreign Application Priority Data

Sep. 10, 2001 (JP) ........................................ 2001-273624

(51) Int. Cl.$^7$ ................................................. C23C 8/00
(52) U.S. Cl. .................. 427/585; 427/252; 427/255.18; 427/255.28; 427/255.31; 427/255.32; 427/255.34; 427/255.36; 427/255.391; 427/255.393; 427/344; 427/397.7
(58) Field of Search ................................ 427/585, 252, 427/255.18, 255.391, 344, 397.7, 255.28, 255.31, 255.32, 255.34, 255.36, 255.393

(56) References Cited

U.S. PATENT DOCUMENTS

| | | | |
|---|---|---|---|
| 367,745 A | 8/1887 | Durst | |
| 677,317 A | 6/1901 | MacDonald | |
| 5,249,554 A | * 10/1993 | Tamor et al. | ............ 123/90.51 |
| 6,060,406 A | 5/2000 | Alers et al. | |
| 6,563,182 B2 | 5/2003 | Horikawa | |
| 6,566,147 B2 | * 5/2003 | Basceri et al. | ................. 438/3 |

FOREIGN PATENT DOCUMENTS

| | | |
|---|---|---|
| JP | 7-193147 | 7/1995 |
| JP | 8-255792 | 10/1996 |
| JP | 11-135774 | 5/1999 |
| JP | 11-330070 | 11/1999 |
| JP | 2000-12840 | 1/2000 |
| JP | 2000-219970 | 8/2000 |
| JP | 3095727 | 10/2000 |

OTHER PUBLICATIONS

W.J. Ol, et al., 2000 Symposium on VLSI Technology Digest of Technical Papers, pps. 40–41, "Performance of MOSFETs With Ultra Thin $ZrO_2$ And Zr Silicate Gate Dielectrics," 2000, no month avail.

S. Nagata, et al., 1993 IEEE International Solid–State Circuits Conference, pp. 285, "A GaAs MMIC Chip–Set For Mobile Communications Using On–Chip Ferroelectric Capacitors," 1993, no month avail.

* cited by examiner

*Primary Examiner*—Bernard Pianalto
(74) *Attorney, Agent, or Firm*—Oblon, Spivak, McClelland, Maier & Neustadt, P.C.

(57) ABSTRACT

An object of the present invention is to provide a liquid material for chemical vapor deposition (CVD), a method of forming a film by CVD and a CVD apparatus, capable of achieving film formation of a silicate compound of good quality. A liquid material for CVD includes an organometallic compound, a siloxane compound and an organic solvent for dissolving the organometallic compound and the siloxane compound. If the organometallic compound includes an alcoxyl group (e.g., tertialy-butoxyl group) having a larger number of carbon atoms than a propoxyl group or a β-diketone group (e.g., 2,2,6,6-tetramethyl-3,5-heptanedionate group), the stability in film formation is improved. As the organic solvent, diethyl ether, tetrahydrofuran, nor-octane, iso-octane and the like may be employed. As the siloxane compound, tri-metoxy-silane having a high degree of solubility in a nonsolar solvent and hexa-methyl-di-siloxane and octa-methyl-cycro-tetra-siloxane both having solubility in a polar solvent may be employed.

13 Claims, 4 Drawing Sheets

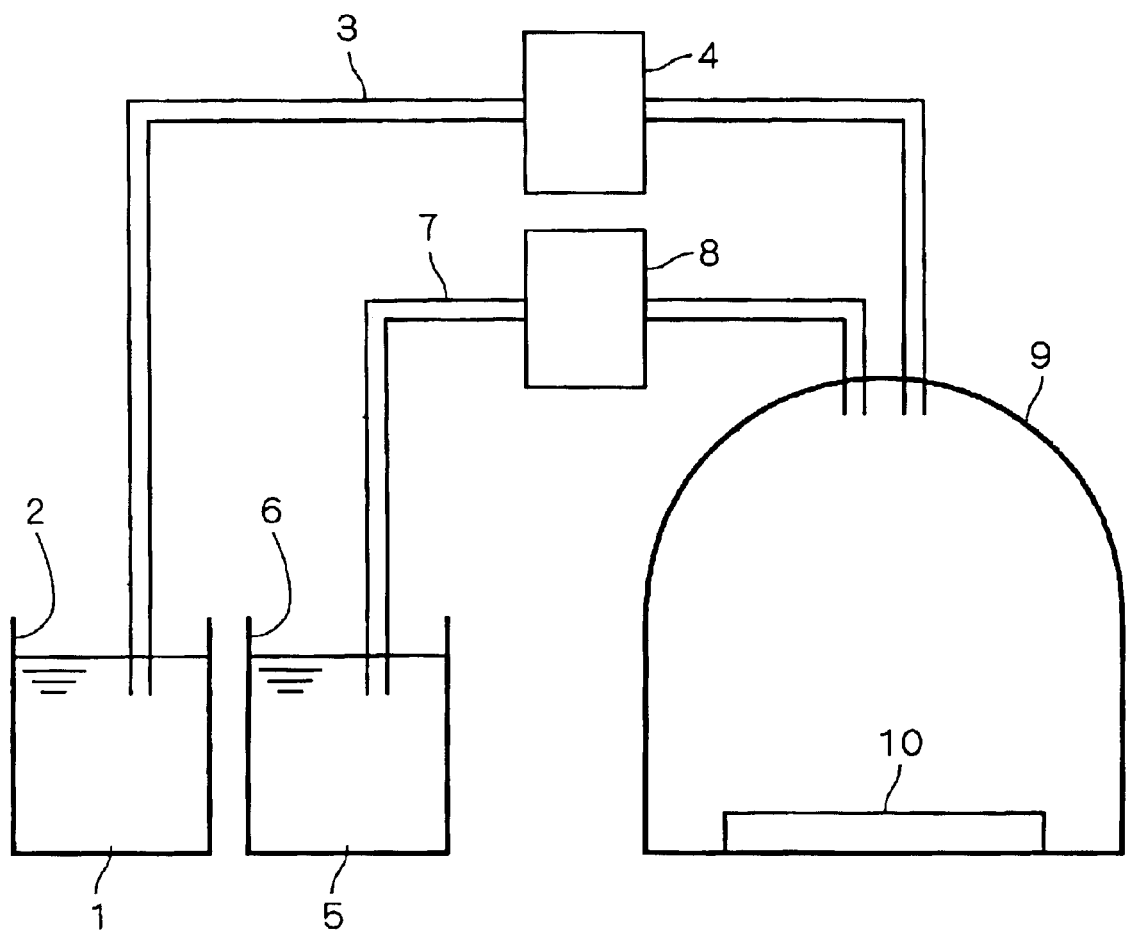
F I G . 1

METHOD OF FORMING A FILM USING CHEMICAL VAPOR DEPOSITION

BACKGROUND OF THE INVENTION

1. Field of the Invention

The present invention relates to formation of a dielectric thin film to be used for various electric elements such as an insulated-gate type field-effect transistor and a thin film capacitor having a laminated structure of metal-insulator-metal. More particularly, it relates to a material for use in chemical vapor deposition (CVD), a method of forming a high dielectric constant thin film by CVD and a CVD apparatus for deposition of the high dielectric constant thin film.

2. Description of the Background Art

With advancement in miniaturization of semiconductor devices, materials employed as dielectric thin films to be used for various electric elements in semiconductor devices are being changed. Recent years, requests have been made for improved storage charge density, for example. Accordingly, the use of a dielectric material having a higher dielectric constant is now under study, instead of a silicon oxide film which has conventionally been employed as a dielectric thin film.

For instance, study is being made as to employment of a high dielectric thin film in a silicon CMOS (Complementary Metal Oxide Semiconductor) logic device instead of a conventional silicon oxynitride film. This is because a next-generation MOSFET is required to ensure high mutual conductance. This is discussed by Wen-Jie Qi et al. in "Performance of MOSFETs with ultra thin $ZrO_2$ and Zr-silicate gate dielectrics", 2000 Symposium on VLSI Technology Digest of Technical Papers (2000) (pp. 40–41), for example.

For the purpose of miniaturization of a high frequency device represented by a GaAs MMIC (Microwave Monolithic IC), miniaturization and integration of an electric element such as a bypass capacitor is now under study. In this study, it is considered to use a thin film capacitor in which a high dielectric constant thin film is employed instead of a conventional silicon nitride film or the like. This is discussed by S. Nagata et al. in "A GaAs MMIC Chip-Set for Mobile Communications Using On-Chip Ferroelectric Capacitors", 1993 IEEE International Solid-State Circuits Conference (1993) (p. 285), for example.

In order to improve storage charge density of a memory cell in a memory device such as DRAM (Dynamic Random Access Memory), the use of a memory cell capacitor using a high dielectric constant thin film is now under study, instead of a stacked structure of a conventional silicon oxide film and a conventional silicon nitride film.

As a high dielectric constant thin film suitable for these applications, attention is now being directed particularly to a dielectric film including a silicate compound for its high chemical stability. The aforementioned document by Wen-Jie Qi et al., for example, shows that, in the case where a $ZrSiO_4$ film as a kind of a silicate compound is directly formed on a silicon substrate, heat treatment at about 700° C. does not cause significant mutual diffusion between the silicon substrate and the $ZrSiO_4$ film. The document also ascertains the operation of a MOSFET in which an ultra thin $ZrSiO_4$ film is used.

As has been described, a silicate compound is useful for a high dielectric constant film used for various electric elements integrated in a semiconductor device. Among methods of forming such a silicate compound, a sputtering method, a method utilizing heat reaction between $ZrO_2$ and Si and the like are in the mainstream under present circumstances.

In an application of a silicate compound to the actual manufacture of LSI, however, it is desirable to form a high dielectric constant film by CVD in view of smoothness and coverage of a step difference in a finished film.

Nevertheless, materials suitable for achieving film deposition of good quality or combination of such materials in forming a high dielectric constant film including a silicate compound have not been clarified. Further, it has not been clarified what treatment should be given to films deposited by CVD to obtain a high dielectric constant film of good quality.

Particularly, in film formation using a plurality of materials, reaction between the materials often causes generation of dust in the vapor phase, adhesion of deposits to a supply conduit and the like. Therefore, there arise problems such as that the supply of materials becomes unstable, resulting in frequent occurrence of variations in the deposition speed each time of film formation. There are no findings at the moment that can contribute to solution of such instability in film formation of a silicate compound which is a high dielectric constant film.

SUMMARY OF THE INVENTION

An object of the present invention is to provide a liquid material for CVD, a method of forming a film by CVD and a CVD apparatus, capable of achieving film formation of a silicate compound of good quality.

An aspect of the present invention is directed to a method of forming a film using chemical vapor deposition, wherein a liquid material for chemical vapor deposition including an organometallic compound, a siloxane compound and an organic solvent for dissolving the organometallic compound and the siloxane compound is vaporized to form one of a film and a precursor film.

The method allows stable deposition of a good quality film in film formation of a silicate compound using CVD. Further, film formation using the liquid material is suitable for the manufacture in light of the ease of material supply.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 shows a CVD apparatus according to a first preferred embodiment of the present invention;

DESCRIPTION OF THE PREFERRED EMBODIMENTS

First Preferred Embodiment

Figure 2:
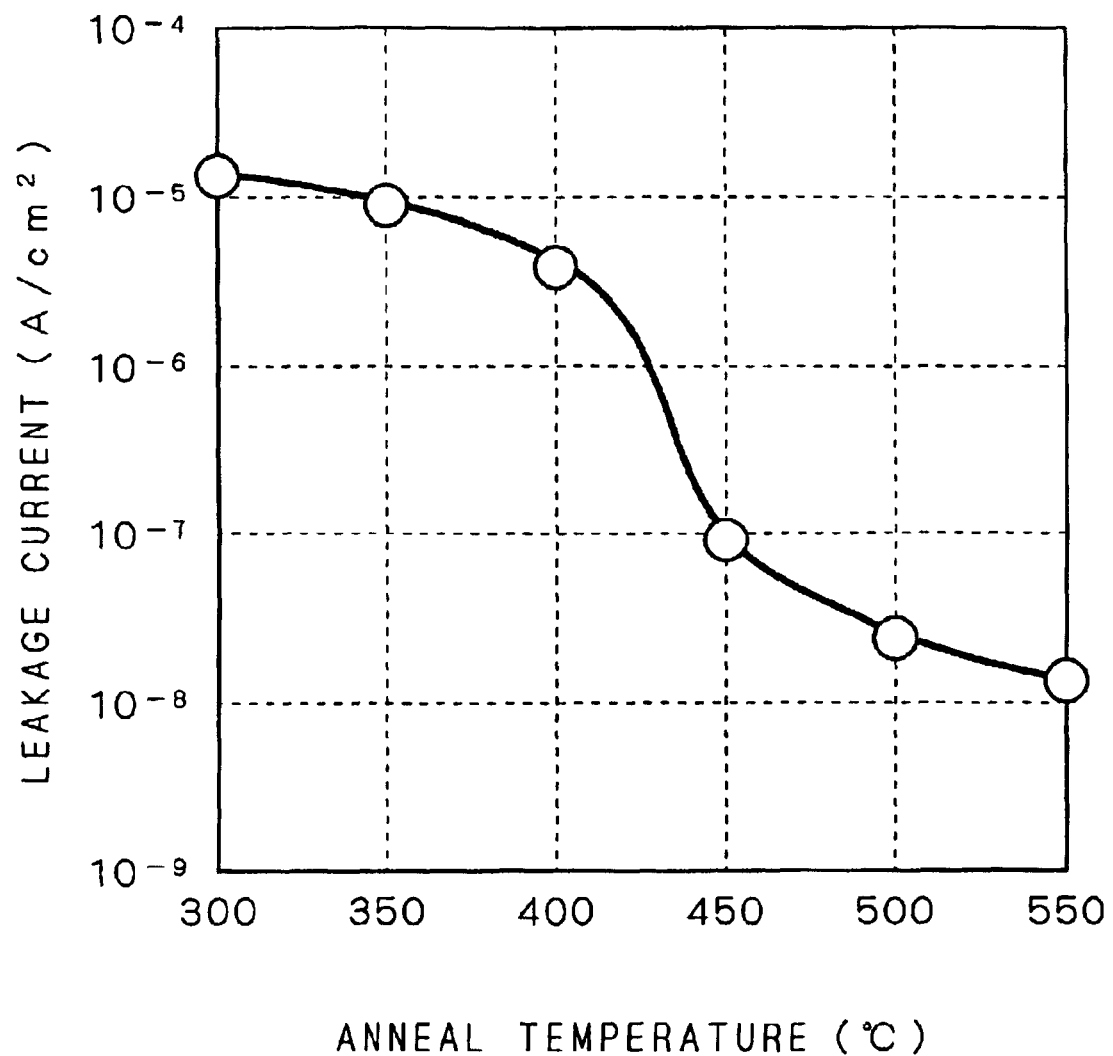
FIG. 2 is a graph showing dependence of leakage current of a precursor film upon anneal temperature.

In the present embodiment, a material for CVD includes an organometallic compound, a siloxane compound and an organic solvent for dissolving the organometallic compound and the siloxane compound, so as to provide a liquid material for CVD, a method of forming a film by CVD and a CVD apparatus, capable of achieving film formation of a silicate compound of good quality.

The inventors of the present application have conducted various experiments to find that the use of an organometallic compound, a siloxane compound and an organic solvent as a material for CVD can achieve film formation of a silicate compound of good quality. The results of the experiments will be discussed later in detail. Explanation will now be given on a CVD apparatus for performing film formation of a silicate compound.

FIG. 1 shows a CVD apparatus according to the present embodiment. As shown in FIG. 1, the CVD apparatus includes: a first material tank 2 for storing a first liquid material 1 which is an organic solvent where a siloxane compound is dissolved; a second material tank 6 for storing a second liquid material 5 which is an organic solvent where an organometallic compound is dissolved; a first vaporization chamber 4 for vaporizing the first liquid material 1 by treatments such as spraying and heating; and a second vaporization chamber 8 for vaporizing the second liquid material 5 by treatments such as spraying and heating.

The CVD apparatus further includes a reaction chamber 9 for forming a high dielectric constant thin film or its precursor film (to be defined later) under oxidizing conditions using the materials vaporized in the first and second vaporization chambers 4 and 8, respectively. Placed within the reaction chamber 9 is a substrate 10 already subjected to heating on which the high dielectric constant thin film is to be formed.

The first material tank 2, the first vaporization chamber 4 and the reaction chamber 9 are connected through a first material supply conduit 3, and the second material tank 6, the second vaporization chamber 8 and the reaction chamber 9 are connected through a second material supply conduit 7.

With a CVD apparatus having such a structure, film formation is performed as described below.

First, the first liquid material 1 in the first material tank 2 is supplied to the first vaporization chamber 4 through the first material supply conduit 3. The first vaporization chamber 4 is depressurized in advance, and further, is heated to a temperature suitable for vaporization of the siloxane compound. Then, vaporization of the first liquid material 1 progresses in the first vaporization chamber 4.

Gas of the organic solvent and the siloxane compound vaporized in the first vaporization chamber 4 is supplied to the reaction chamber 9. The supplied gas is decomposed and reacted over the high-temperature substrate 10 placed in the reaction chamber 9, thereby performing film formation of a silicate compound which is a high dielectric constant thin film.

The second liquid material 5 is also vaporized in the second vaporization chamber 8 similarly to the first liquid material 1, and the resultant gas is decomposed and reacted in the reaction chamber 9, thereby forming the silicate compound.

The first and second liquid materials 1 and 5 may be supplied to the reaction chamber 9 simultaneously or alternately.

In the film formation, if an oxidized gas is introduced in the reaction chamber 9, the oxidized gas promotes oxidization after decomposition of the organometallic adsorbed on a surface of the substrate to expedite formation of a dielectric thin film of good quality. Examples of such an oxidized gas are carbon monoxide, carbon dioxide, water vapor, oxygen and ozone.

On the other hand, if an oxidized gas is not introduced in the reaction chamber 9, a thin film becomes a precursor film, which requires the substrate to be taken out afterwards and to be subjected to oxidization such as annealing under oxidizing conditions. Here, the precursor film refers to a film whose metal ion is not fully oxidized, which becomes a good dielectric only after subjected to annealing under oxidizing conditions.

As described in Description of the Background Art, in film formation using a plurality of materials, the materials, if supplied simultaneously, for example, into a reaction chamber, react with each other in the vapor phase, which often causes generation of dust and adhesion of deposits to a supply conduit. The generation of dust and adhesion of deposits make the supply of materials unstable, resulting in occurrence of variations in the deposition speed of the materials each time of film formation. Since such variations in the deposition speed closely affect product yields in the manufacturing process, it is necessary to find a combination of materials which less causes such variations.

Even when the materials are not supplied simultaneously, molecules of a material adsorbed on wall surfaces of the reaction chamber and the conduits may react with those of another material supplied subsequently. Thus, the problem also arises in the case of alternately supplying a plurality of materials.

Accordingly, the inventors of the present application performed experiments using many kinds of materials. As a result, they found that a liquid material for CVD could be made by dissolving a siloxane compound and an organometallic compound in an organic solvent, as will be discussed in specific examples below. The following combinations of materials allows film formation to be achieved stably without a phenomenon such as generation of dust.

Further, since neither a siloxane compound nor an organometallic compound has high reactivity with an oxidized gas such as oxygen, it was found that the problem of generation of dust and the like seldom arose even when materials in the vapor phase were supplied simultaneously into the reaction chamber, and film deposition could therefore be achieved with excellent stability.

Tables 1 and 2 show the results of experiments on combinations of various materials for forming a zirconium silicate film as an example of a silicate compound. The experiments were performed to study a decrease in the amount of film formation after performing ten times of film formation with each combination of various materials using the CVD apparatus shown in FIG. 1.

TABLE 1

| FIRST MATERIAL | SECOND MATERIAL | ORGANIC SOLVENT | $1^{ST}$ TIME $(ug/cm^2)$ | $3^{RD}$ TIME $(ug/cm^2)$ | $10^{TH}$ TIME $(ug/cm^2)$ | RATE OF CHANGE (%) | GOOD COMBINATION |
|---|---|---|---|---|---|---|---|
| $ZrCl_2$ | $SiH_4$ | None (gas) | 42 | 36 | 29 | 31 | |
| $Zr(i-PrO)_3(THD)$ | $SiH_4$ | None (gas) | 38 | 33 | 29 | 24 | |
| $ZrCl_2$ | $Si_2H_6$ | None (gas) | 49 | 32 | 16 | 67 | |

TABLE 1-continued

| FIRST MATERIAL | SECOND MATERIAL | ORGANIC SOLVENT | 1ST TIME (ug/cm$^2$) | 3RD TIME (ug/cm$^2$) | 10TH TIME (ug/cm$^2$) | RATE OF CHANGE (%) | GOOD COMBINATION |
|---|---|---|---|---|---|---|---|
| Zr(i-PrO)$_3$(THD) | Si$_2$H$_6$ | None (gas) | 36 | 31 | 23 | 36 | |
| ZrCl$_2$ | TEOS | None (gas) | 36 | 32 | 27 | 25 | |
| Zr(i-PrO)$_3$(THD) | TEOS | None (gas) | 32 | 31 | 26 | 19 | |
| ZrCl$_2$ | TMS | None (gas) | 39 | 26 | 24 | 38 | |
| Zr(i-PrO)$_3$(THD) | TMS | None (gas) | 33 | 29 | 28 | 15 | |
| ZrCl$_2$ | TMS | Nor-octane solution | 37 | 44 | 30 | 19 | |
| Zr(i-PrO)$_3$(THD) | TMS | Nor-octane solution | 35 | 35 | 34 | 3 | ○ |
| ZrCl$_2$ | TMS | Iso-octan solution | 36 | 33 | 26 | 28 | |
| Zr(i-PrO)$_3$(THD) | TMS | Iso-octan solution | 33 | 33 | 32 | 3 | ○ |
| ZrCl$_2$ | HMDSO | None (gas) | 26 | 22 | 19 | 27 | |
| Zr(i-PrO)$_3$(THD) | HMDSO | None (gas) | 24 | 22 | 16 | 33 | |
| Zr(i-PrO)$_3$(THD) | HMDSO | Methanol solution | 19 | 8 | 4 | 79 | |
| Zr(i-PrO)$_3$(THD) | HMDSO | Acetone solution | 14 | 7 | 6 | 57 | |
| Zr(i-PrO)$_3$(THD) | HMDSO | Diethyl ether solution | 29 | 27 | 26 | 10 | |
| Zr(i-PrO)$_3$(THD) | HMDSO | Tetrahydrofuran solution | 32 | 31 | 32 | 0 | ○ |

TABLE 2

| FIRST MATERIAL | SECOND MATERIAL | ORGANIC SOLVENT | 1ST TIME (ug/cm$^2$) | 3RD TIME (ug/cm$^2$) | 10TH TIME (ug/cm$^2$) | RATE OF CHANGE (%) | GOOD COMBINATION |
|---|---|---|---|---|---|---|---|
| Zr(t-BuO)$_3$(THD) | HMDSO | Tetrahydrofuran solution | 33 | 32 | 33 | 0 | ○ |
| Zr(MeO)$_3$(THD) | HMDSO | Tetrahydrofuran solution | 30 | 25 | 20 | 33 | |
| ZrCl$_2$ | HMDSO | Nor-octane solution | 40 | 33 | 33 | 18 | |
| Zr(i-PrO)$_3$(THD) | HMDSO | Nor-octane solution | 31 | 30 | 30 | 3 | ○ |
| ZrCl$_2$ | HMDSO | Iso-octan solution | 35 | 31 | 26 | 26 | |
| Zr(i-PrO)$_3$(THD) | HMDSO | Iso-octan solution | 31 | 31 | 30 | 3 | ○ |
| ZrCl$_2$ | OMCTS | None (gas) | 32 | 25 | 12 | 63 | |
| Zr(i-PrO)$_3$(THD) | OMCTS | None (gas) | 20 | 16 | 12 | 40 | |
| ZrCl$_2$ | OMCTS | Methanol solution | 33 | 20 | 9 | 73 | |
| Zr(i-PrO)$_3$(THD) | OMCTS | Methanol solution | 18 | 12 | 9 | 50 | |
| Zr(i-PrO)$_3$(THD) | OMCTS | Acetone solution | 16 | 10 | 5 | 69 | |
| Zr(i-PrO)$_3$(THD) | OMCTS | Diethyl ether solution | 25 | 24 | 23 | 8 | ○ |
| Zr(i-PrO)$_3$(THD) | OMCTS | Tetrahydrofuran solution | 26 | 26 | 24 | 8 | ○ |
| ZrCl$_2$ | OMCTS | Nor-octane solution | 36 | 25 | 29 | 19 | |
| Zr(i-PrO)$_3$(THD) | OMCTS | Nor-octane solution | 28 | 27 | 29 | −4 | ○ |
| ZrCl$_2$ | OMCTS | Iso-octan solution | 33 | 27 | 26 | 21 | |
| Zr(i-PrO)$_3$(THD) | OMCTS | Iso-octan solution | 29 | 27 | 28 | 3 | ○ |

The "first material" in Tables refers to the organometallic compound in the second liquid material 5 shown in FIG. 1 (a zirconium compound here), and the "second material" refers to the siloxane compound in the first liquid material 1 shown in FIG. 1. The "organic solvent" refers to the organic solvent in the first and second liquid materials 1 and 5.

In the column of "organic solvent", "None (gas)" refers to the case that the organometallic compound and the siloxane compound were directly vaporized without using an organic solvent. (In this case, the first and second liquid materials 1, 5 and the first and second material tanks 2, 6 shown in FIG. 1 were omitted, and the organometallic compound and the siloxane compound were directly supplied into the first and second vaporization chambers 4 and 8.)

In Tables 1 and 2, each numerical value in the column of "1st time" shows the amount of deposition (indicated by weight) per unit area in a certain period of time at the first time of film formation after supplying the materials into the reaction chamber. Numerical values in the columns of "3rd time" and "10th time" similarly show the amount of deposition per unit area at the 3rd time and the 10th time of film formation, respectively. Film formation was performed each time for 10 minutes under oxidizing conditions at the substrate temperature of 450° C. with the supply of materials of 1 μmol/min.

The "rate of change" in Tables refers to a value obtained by dividing a difference between the amount of film formation of the 1st time and that of the 10th time by the amount of the 1st time. For instance, referring to the first row in Table 1 in which $ZrCl_2$ and $SiH_4$ were used without an organic solvent, the amount of film formation of the 1st time is 42 μg/cm$^2$ whereas that of the 10th time was reduced to as small as 29 μg/cm$^2$. In this case, the rate of change is obtained by the expression (42−29)/42=31%.

Combinations indicated as "good combination" with the mark ○ refer to the cases that the rate of change has a small value. That the rate of change has a small value means that it is a combination of materials by which variations are difficult to be made in the deposition speed of the materials at each time of film formation. Thus, it is possible to perform film formation of a zirconium silicate film of good quality.

Ligands of the zirconium compounds listed as the first material are as follows: i-PrO, MeO and t-BuO refer to an iso-propoxyl group, a methoxyl group and a tertiary-butoxyl group, respectively, all of which belong to an alkoxyl group; THD refers to a 2,2,6,6-tetramethyl-3,5-heptanedionate group, which belongs to a β-diketone group.

The materials listed as the second material are as follows: TEOS refers to tetra-ethoxy-silane, TMS refers to tri-methoxy-silane, HMDSO refers to hexa-methyl-di-siloxane, and OMCTS refers to octa-methyl-cyclo-tetra-siloxane.

From the results shown in Tables 1 and 2, the following can be judged.

(1) Among the organometallic compounds, one that includes the alkoxyl group (e.g., t-BuO) or the β-diketone group (e.g., THD) having carbon atoms not less than those of the propoxyl group has better stability in film formation than another one having an organic ligand such as MeO with a small number of carbon atoms.

(2) Among the organic solvents, ethers (including circular ethers) such as diethyl ether, tetrahydrofuran, nor-octane and iso-octane and saturated hydrocarbons have better stability in film formation than acetone.

(3) As a feedstock of silicon, a siloxane compound has stability in film formation better than that of silane and disilane.

(4) As a feedstock of silicon, TMS having a high degree of solubility in a nonpolar solvent and HMDSO and OMCTS both having solubility in a polar solvent such as alcohols have better stability in film formation than TEOS having inferior solubility in an organic solvent.

Although oxygen was used as an oxidized gas in the experiments shown in Tables 1 and 2, the same results were obtained using carbon monoxide, carbon dioxide, water vapor and the like.

Further, the same experiments were performed as to the case that no oxidized gas was supplied, from which the same results were obtained as to the suitability of combinations of materials for forming a precursor film. The result of the study of dependence of leakage current of the precursor film on the anneal temperature shown in FIG. 2 revealed that the precursor film was inverted into a silicate film by furnace anneal performed under oxidizing conditions at about 450° C. or higher and came to have high resistance.

Although Tables 1 and 2 show the case of forming a zirconium silicate film, the same results were obtained in the case of forming an aluminum silicate film, a hafnium silicate film, a titanium silicate film, a tantalum silicate film, a scandium silicate film, an yttrium silicate film, a lanthanum silicate film, a cerium silicate film, a praseodymium silicate film, a neodymium silicate film, a promethium silicate film, a samarium silicate film, an europium silicate film, a gadolinium silicate film, a terbium silicate film, a dysprosium silicate film, a holmium silicate film, an erbium silicate film, a thulium silicate film, an ytterbium silicate film and a lutetium silicate film.

More specifically, the tendencies indicated in the above (1) to (4) were also ascertained as a result of experiments in metal groups including $Hf(t-BuO)_4$, $Ti(t-BuO)_2(THD)_2$, $Y(THD)_3$, $La(THD)_3$ and the like in addition to $Zr(i-PrO)_3$ (THD) indicated in Tables.

Aside from the aforementioned ethers and saturated hydrocarbons, alcohols such as ethanol and methanol and ketones such as diethyl ketone may be employed as an organic solvent. The effect of stability in film formation can also be expected by the use of unsaturated fatty acid and aromatics.

According to the present embodiment, the liquid material for CVD includes an organometallic compound, a siloxane compound and an organic solvent. This allows stable deposition of a good quality film in the film formation of a silicate compound using CVD. Further, the film formation using a liquid material is suitable for the manufacture in light of the ease of material supply.

The use of an organic solvent including, as a main component, at least one element selected from the group consisting of ethers (including circular ethers) and saturated hydrocarbons improves the stability in film formation.

Particularly, the use of an organic solvent including at least one element selected from the group consisting of diethyl ether, tetrahydrofuran, nor-octane and iso-octane as a main component further improves the stability in film formation.

The use of a siloxane compound including, as a main component, at least one element selected from the group consisting of TMS, HMDSO and OMCTS improves the stability in film formation of a silicate compound using CVD.

The use of an organometallic compound including, as a main component, at least one element selected from the group consisting of Al, Zr, Hf, Ti, Ta, Sc, Y, La, Ce, Pr, Nd, Pm, Sm, Eu, Gd, Tb, Dy, Ho, Er, Tm, Yb and Lu improves the stability in film formation.

The use of an organometallic compound including, as a ligand, at least one element selected from the group consisting of the β-diketone group and the alkoxyl group having carbon atoms not less than those of the propoxyl group improves the stability in film formation.

Particularly, the use of an organometallic compound including, as a ligand, at least one element selected from the group consisting of THD and t-BuO further improves the stability in film formation.

With the method of film formation using CVD for forming a film or a precursor film by vaporizing a liquid material as described above and the CVD apparatus to be used for the film formation, stable deposition of a good quality film can be achieved in the film formation of a silicate compound using CVD. Further, the film formation using a liquid material is suitable for the manufacture in light of the ease of material supply.

When a precursor film is formed, annealing is subsequently performed under oxidizing conditions, so that oxidization of the precursor film which has not fully been oxidized further progresses. Thus, a film of high insulation properties can be formed.

<Second Preferred Embodiment>

The present embodiment is a variant of the method of forming a film by CVD and the CVD apparatus according to the first embodiment, in which the organometallic compound and the siloxane compound are vaporized in a single vaporization chamber at a different time from each other. This allows vaporization with a simple arrangement of the apparatus.

The CVD apparatus of the first embodiment are provided with the first and second vaporization chambers 4 and 8 for separately vaporizing the organometallic compound and the siloxane compound. That is, these compounds are vaporized respectively in the vaporization chambers provided separately.

When the organometallic compound and the siloxane compound are materials having vaporization temperatures greatly different from each other, the above arrangement allows these compounds to be vaporized at vaporization temperatures suitable for the respective materials.

However, the use of a plurality of vaporization chambers results in a complex arrangement of the apparatus. Therefore, the organometallic compound and the siloxane compound are vaporized in a single vaporization chamber at a different time from each other. This allows vaporization with a simple arrangement of the apparatus.

Figure 3:
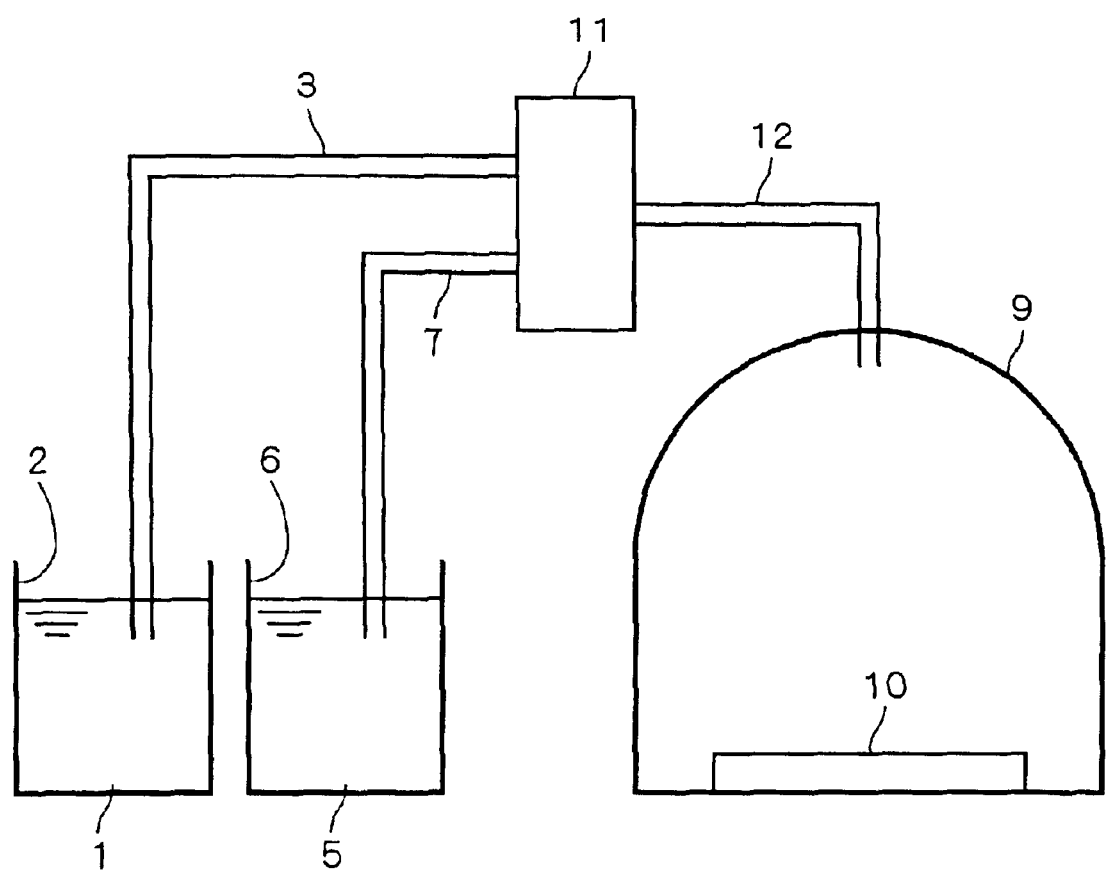
FIG. 3 shows a CVD apparatus according to a second preferred embodiment of the present invention.

FIG. 3 shows a CVD apparatus according to the present embodiment. As shown in the drawing, the CVD apparatus has a third vaporization chamber 11 instead of the first and second vaporization chambers 4 and 8 provided with the CVD apparatus shown in FIG. 1. The first and second material supply conduits 3 and 7 extending from the first and second material tanks 2 and 6, respectively, are connected to the third vaporization chamber 11, and the third vaporization chamber 11 and the reaction chamber 9 are connected through a third material supply conduit 12.

The CVD apparatus arranged as described above uses the third vaporization chamber 11 at different times for alternately vaporizing the first and second liquid materials 1 and 5, which are then supplied to the reaction chamber 9. This allows vaporization with a simple arrangement of the apparatus.

When the organometallic compound and the siloxane compound have vaporization temperatures different from each other, temperature control may be carried out in the third vaporization chamber 11. When their vaporization temperatures are not very different, the first and second liquid materials 1 and 5 may be supplied alternately to the third vaporization chamber 11 without changing a vaporization temperature.

<Third Preferred Embodiment>

The present embodiment is a variant of the method of forming a film by CVD and the CVD apparatus according to the second embodiment, in which the organometallic compound and the siloxane compound are both dissolved in an organic solvent into a mixture in a single material tank, and the mixture is vaporized. This allows vaporization with a simple arrangement of the apparatus.

The CVD apparatuses of the first and second embodiments are each provided with the first and second material tanks 2 and 6, in which the metal organic compound and the siloxane compound are dissolved in individual solvents.

With this arrangement, the organometallic compound and the siloxane compound can be used in CVD without reacting upon each other, even if these compounds have properties of easily reacting upon each other when dissolved in the same solvent.

However, the use of a plurality of material tanks results in a complex arrangement of the apparatus. Therefore, the organometallic compound and the siloxane compound are both dissolved in a solvent prepared in a single material tank into a mixture, and the mixture is vaporized. This allows vaporization with a simple arrangement of the apparatus.

Figure 4:
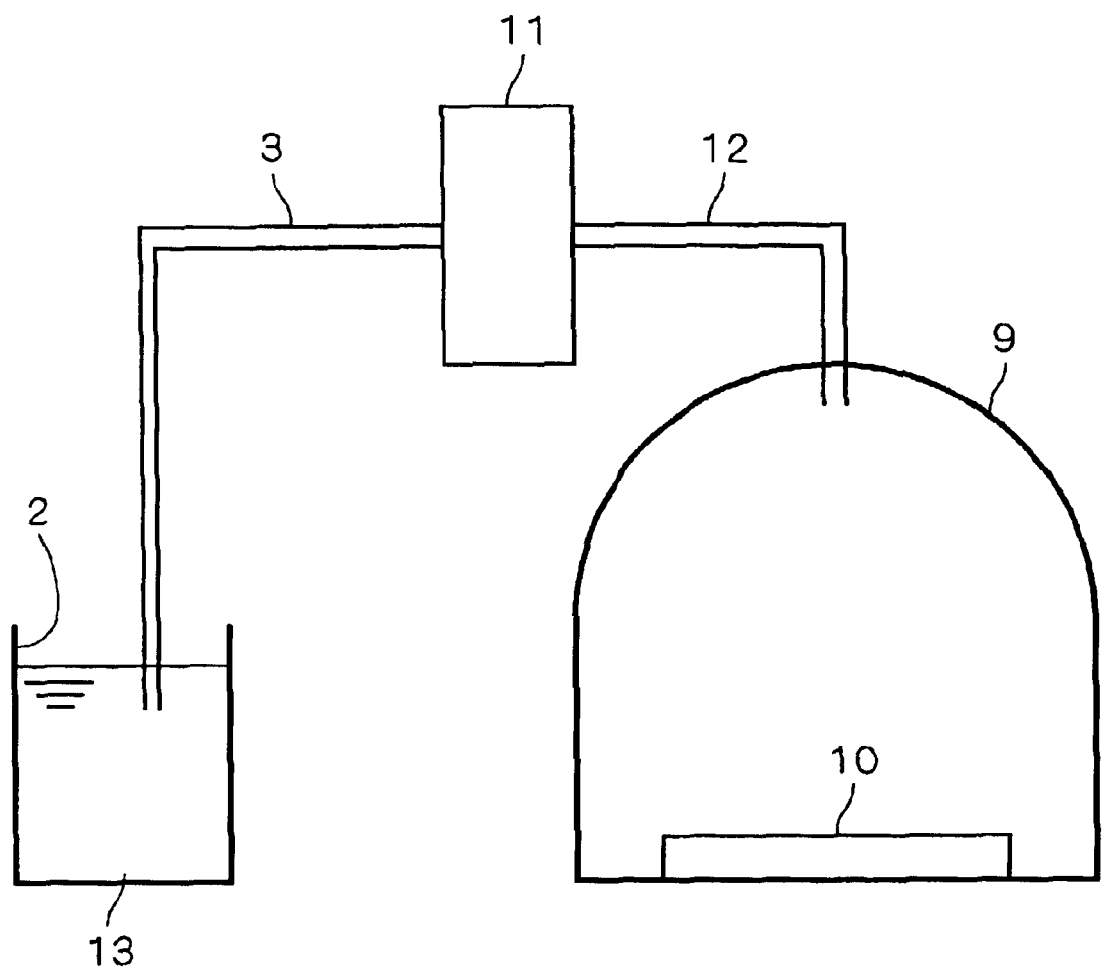
FIG. 4 shows a CVD apparatus according to a third preferred embodiment of the present invention.

FIG. 4 shows a CVD apparatus according to the present embodiment. As shown in the drawing, the second material tank 6 and the second material supply conduit 7 provided with the CVD apparatus shown in FIG. 3 are omitted in the CVD apparatus of the present embodiment. Stored in the first material tank 2 is a third liquid material 13, a mixture into which the organometallic compound and the siloxane compound are dissolved in an organic solvent.

In the CVD apparatus arranged as described above, the organometallic compound and the siloxane compound included in the third liquid material 13 are vaporized simultaneously in the third vaporization chamber 11 unless their vaporization temperatures are greatly different from each other. This allows vaporization with a simple arrangement of the apparatus compared to that when the organometallic compound and the siloxane compound are vaporized separately.

While the invention has been shown and described in detail, the foregoing description is in all aspects illustrative and not restrictive. It is therefore understood that numerous modifications and variations can be devised without departing from the scope of the invention.

What is claimed is:

1. A method of forming a film using chemical vapor deposition, wherein
   a liquid material for chemical vapor deposition including an organometallic compound, a siloxane compound and an organic solvent for dissolving said organometallic compound and said siloxane compound is vaporized to form one of a film and a precursor film.

2. The method according to claim 1, wherein
   said organometallic compound and said siloxane compound are both dissolved in said organic solvent into a mixture, and
   said mixture is vaporized.

3. The method according to claim 1, wherein
   said organic solvent includes first and second organic solvent prepared in separate tanks, respectively;
   said organometallic compound is dissolved in said first organic solvent; and
   said siloxane compound is dissolved in said second organic solvent.

4. The method according to claim 3, wherein
   said organometallic compound and said siloxane compound are subjected to vaporization separately, and
   said vaporization is performed in separate vaporization chambers, respectively.

5. The method according to claim 3, wherein
   said organometallic compound and said siloxane compound are subjected to vaporization separately, and
   said vaporization is performed in a single vaporization chamber for said organometallic compound and said siloxane compound at different times, respectively.

6. The method according to claim 1, wherein
   when said precursor film is formed, annealing is subsequently performed under oxidizing conditions.

7. The method according to claim 1, wherein
   said organic solvent includes, as a main component, at least one element selected from the group consisting of ethers and saturated hydrocarbons.

8. The method according to claim 7, wherein
said organic solvent includes, as a main component, at least one element selected from the group consisting of diethyl ether, tetrahydrofuran, nor-octane and iso-octane.

9. The method according to claim 7, wherein the main component is a cyclic ether.

10. The method according to claim 1, wherein
said organometallic compound includes, as a metal element, at least one element selected from the group consisting of Al, Zr, Hf, Ti, Ta, Sc, Y, La, Ce, Pr, Nd, Pm, Sm, Eu, Gd, Tb, Dy, Ho, Er, Tm, Yb and Lu.

11. The method according to claim 1, wherein
said organometallic compound includes, as a ligand, at least one element selected from the group consisting of a β-diketone group and an alkoxyl group having carbon atoms not less than those of a propoxyl group.

12. The method according to claim 11, wherein
said organometallic compound includes, as a ligand, at least one element selected from the group consisting of a 2,2,6,6-tetramethyl-3,5-heptanedionate group and a tertiary-butoxyl group.

13. The method according to claim 1, wherein
said siloxane compound includes, as a main component, at least one element selected from the group consisting of tri-methoxy-silane, hexa-methyl-di-siloxane and octa-methyl-cyclo-tetra-siloxane.

* * * * *